Aug. 3, 1965 J. F. DYBEN 3,199,001

TEMPERATURE STABLE TRANSISTOR DEVICE

Filed Dec. 8, 1960

INVENTOR.
JERRY F. DYBEN
BY Gust & Irish
ATTORNEYS

United States Patent Office 3,199,001
Patented Aug. 3, 1965

3,199,001
TEMPERATURE STABLE TRANSISTOR DEVICE

Jerry F. Dyben, New Haven, Ind., assignor to Microtronics, Inc., New Haven, Ind.

Filed Dec. 8, 1960, Ser. No. 74,710
10 Claims. (Cl. 317—234)

The present invention relates to a transistor and more particularly to a transistor of improved thermal stability.

Among the functional limitations of transistors is the one of thermal runaway. This phenomenon is observed as the rapid buildup of collector current with increase of junction temperature, such buildup progressing to the point at which the transistor burns out.

In order to minimize this hazard as much as possible, many different heat-dissipating structures have been proposed and used. A popular design utilizes a heat sink comprising a metal plate of relatively large mass on which the transistor crystal is directly mounted. In assembling the transistor to a piece of electronic equipment, the plate is fastened directly to a relatively large metal chassis which is relied upon to carry the heat away from the transistor by conduction. Thus, in the past, thermal runaway has been controlled to some extent by the use of certain physical structures having high heat-dissipating capabilities. This approach to the problem has its obvious limitations, because if the temperature of the heat sink is elevated too high, then the transistor has no way of disipating its heat and therefore destroys itself.

A still further problem exists in the fabrication of transistors. If it is desired to obtain beta characteristics of a particular number, such as forty, present manufacturing techniques require the manufacturing of a relatively large number of transistors which inherently vary individually over a wide range of beta values; e.g., 20 to 100. It is therefore necessary to measure and select those transistors having a beta value of 40, the remaining transistors either being rejects or having limited usefulness.

In view of the foregoing, it is an object of this invention to provide a transistor having improved thermal stability characteristics.

It is another object of this invention to provide a transistor construction whereby selected beta values may be easily achieved.

It is still a further object to provide a transistor having improved characteristics of heat dissipation, shock resistance and thermal stability, all of these characteristics being achieved by a single unitary structure.

Other objects will become apparent as the description proceeds.

The objects of this invention may be achieved by a transistor device which comprises a metallic mounting plate, a transistor crystal having emitter, base and collector portions, the collector portion being mounted directly onto the mounting plate, two terminal leads passing through the mounting plate and being insulated therefrom, these leads being spaced apart, a base connection leading from the base portion to one of the leads, an emitter connection leading from the emitter portion to the other of the leads, a disc of material having a negative resistance characteristic having one surface thereof coated with conductive material, this disc being superposed onto said one lead with the conductive surface being in electrical contact therewith, an annular wall of insulation surrounding the crystal, the leads and the disc and being secured at one end to the mounting plate, epoxy-aluminum material partially filling the space inside the annular wall to just cover the crystal and the periphery of the disc leaving the other disc surface and the other lead exposed, the epoxy-aluminum material bonding the disc into place with respect to the two leads and the crystal, amalgam filling the remaining space inside the wall and covering the epoxy-aluminum material, the other disc surface and the other lead, the amalgam electrically connecting the other disc surface to the other lead, and a cover fitted over the wall and the amalgam.

The above-mentioned and other features and objects of this invention and the manner of obtaining them will become more apparent and the invention itself will be best understood by reference to the following description of an embodiment of the invention taken in conjunction with the accompanying drawings, wherein.

Figures 1, 2, 3, 4:
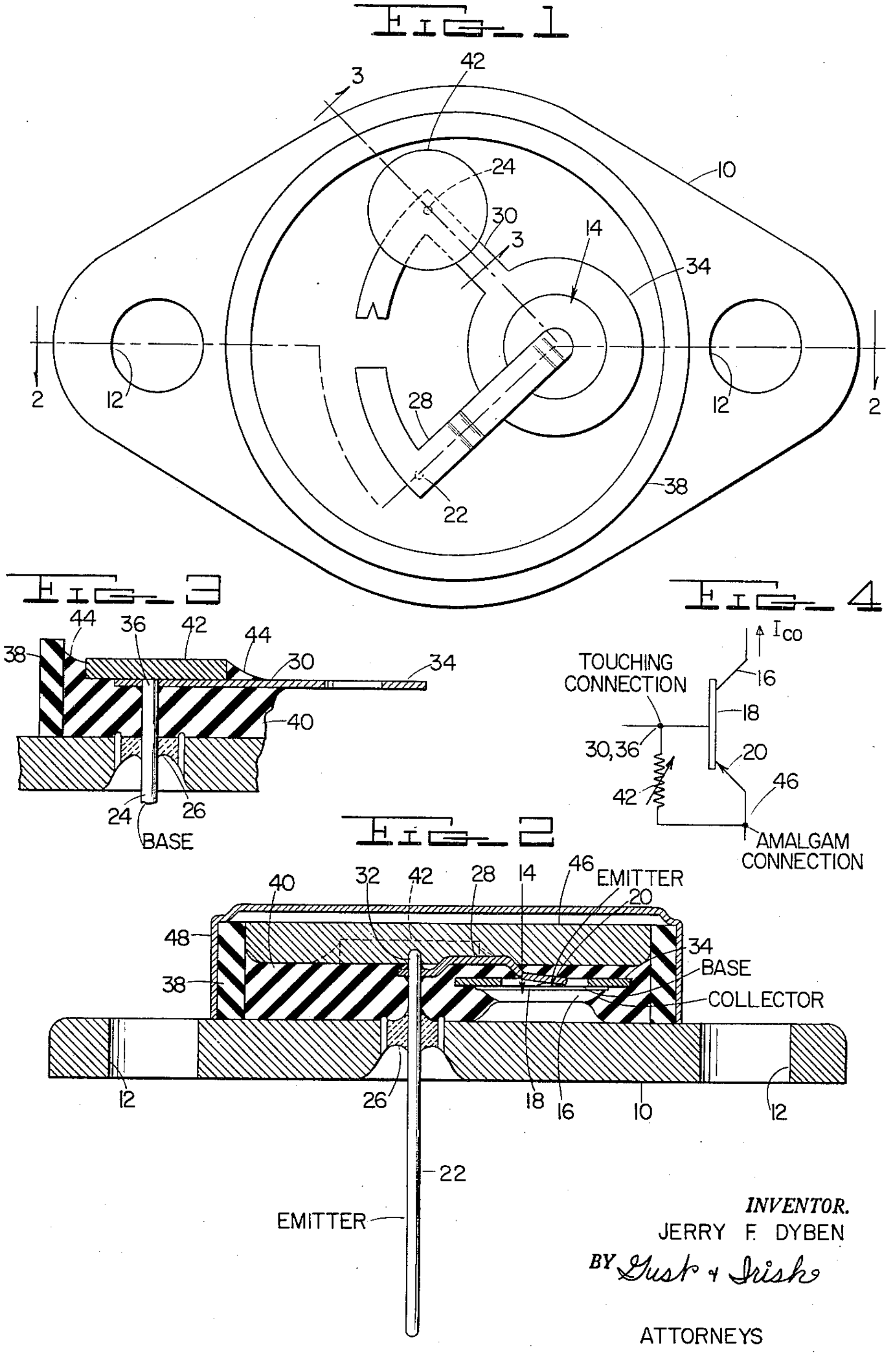
FIG. 1 is a top plan view of one embodiment of this invention with the cover removed therefrom and before potting compound is flowed into place.
FIG. 2 is a sectional illustration taken substantially along section line 2—2 of FIG. 1.
FIG. 3 is a partial sectional illustration taken substantially along section line 3—3 of FIG. 1.
FIG. 4 is an equivalent circuit diagram used in explaining the operation of the invention.

Referring to the drawings, and more particularly to FIGS. 1 and 2, a relatively thick, metallic mounting plate 10 is provided with two diametrically opposed mounting apertures 12. In the central portion of the mounting plate 10 and secured thereto in a conventional manner is the transistor crystal indicated generally by the reference numeral 14. The crystal 14 is composed of the usual three elements, a collector 16, a base 18 and an emitter 20. The particular transistor illustrated is of the PNP type.

The collector 16 is intimately mounted on the plate 10 in heat-conducting relationship such that any heat generated in the transistor will be rapidly conducted away therefrom by the mounting plate 10. This is conventional construction.

By reason of the fact that the collector 16 is mounted directly on the mounting plate 10, the latter serves as an electrical terminal for the collector. The remaining terminals or leads for the emitter and base elements, respectively, are indicated by the reference numerals 22 and 24, these leads passing through the plate 10 and being insulated therefrom by beads 26 of a glass plastic or the like.

These leads 22 and 24 are connected to the emitter and base portions, respectively, of the transistor by metallic ribbons or connections indicated by the numerals 28 and 30, respectively. The lead 28 abuttingly connects at its right-hand end (FIG. 2) to the emitter portion 20 of the transistor crystal, and at its left-hand end is suitably soldered to the upper end 32 of the emitter lead 22.

Similarly, the connection 30 having an annular contact portion 34 abuttingly connects to the base portion 18 of the crystal 14 and extends to the upper end 36 of the base lead 24 to which it is soldered. (FIG. 3). The structure thus far described is conventional.

An annular wall 38 of aluminum-containing epoxy plastic or potting compound in hardened form is positioned on the mounting plate 10 as shown in the drawings, and is there adhered in place by the same material in liquid or plastic form. With the annular wall 38 so mounted, a quantity of the aluminum-containing epoxy in plastic or liquid form is flowed into the interior thereof onto the top of the mounting plate 10, until it reaches a level above that of the crystal 14 but just below the top 36 of the lead 24. This epoxy flowed into proper position is indicated by the reference numeral 40 in FIG. 2. The epoxy is permitted to harden, which serves to rigidly bind and hold all of the assembled parts together.

In some instances it has been found that the epoxy resin corrosively attacks the transistor crystal 14. In order to prevent this, the crystal 14 may be coated with polyethylene wax just before the potting compound 40 is flowed into place. When the polyethylene wax is used, it is applied by touching the pointed end of a stick of the wax to the surface of the crystal 14.

The crystal preferably is preheated to insure that the wax will flow over the surface. Other isolating agents for preventing corrosive attack of the potting compound on the transistor crystal may be used without departing from the spirit and scope of this invention.

After the potting compound 40 hardens, any compound which may have covered the upper surface of the end 36 of the lead 24 and the upper surface of the strip connection 30 is scraped off to expose bare metal. A thermistor 42 of disc shape is placed on the upper surface of the potting compound 40 so as to make electrical contact with the upper surfaces of the lead 30 and lead tip 36. The electrical connection between the thermistor 42 and the parts 30 and 36 preferably comprises a coating of fired silver or the like on the under surface of the thermistor 42. Obviously, any other suitably conductive material may be used instead of the silver paint.

Following this, a small quantity of potting compound 44 is flowed around the periphery of the thermistor 42 for the purpose of bonding it securely in place to the remaining assembly.

In an alternative assembly procedure, before potting, the silvered side of the thermistor 42 is soldered to the tip 36 by the application of a spot of solder, and just enough heat to melt the solder. This provides a secure electrical connection between the thermistor 42 and the lead 24. Following this, the potting compound is flowed into place to a level which surrounds the periphery of the thermistor.

The polyethylene wax is preferably applied to the crystal 14 prior to the soldering operation and with the temperature of the crystal slightly elevated.

In the next step of construction, any potting compound which may be covering the upper end of the lead 22 and the upper surface of the ribbon connection 28 is scraped off leaving bare metal exposed. Following this, a quantity of amalgam 46 (FIG. 2) heated to a temperature which causes it to flow is poured over the entire assembly to fill the remaining space inside the annular wall 38. It now makes an electrical contact between the upper surface of the thermistor 42 and the emitter lead 22, 28, and thereby the thermistor is directly connected, by means which is bidirectionally conductive, between the emitter and base.

As the last step of construction, a suitable metallic cover 48 is intimately fitted over the wall 38 so as to close the assembly while the amalgam is still hot.

While potting compound other than the aluminum containing epoxy resin may be used, experimental results have proven this material to be quite satisfactory. A particularly suitable formula contains one hundred (100) grams of epoxy resin, two hundred (200) grams of colloidal or powdered aluminum and ten (10) grams of diethylene triamine in liquid form. This material is an electrical insulator but a good thermal conductor. Other materials having these same properties may be used without departing from the scope of this invention.

The amalgam 46 has a formulation consisting of one hundred (100) grams of mercury and forty-two (42) grams of Wood's metal and melts at approximately thirty-five (35°) degrees C. When the amalgam is added to the assembly, it is heated to seventy-five (75°) degrees C., first. It is then poured over the assembly while it is still at or near the 75° C. temperature. Following this, the amalgam is combed off flush with the top of the annular wall 38. While amalgam has herein been specified, any good conductor having a relatively low temperature melting point may be used so as to facilitate the making of an electrical connection from the upper surface of the thermistor 42 to the emitter lead 32, 28.

The equivalent circuit of the transistor with like numerals indicating like parts is illustrated in FIG. 4. The thermistor 42 is permanently connected across the base and emitter leads. Since the thermistor 42 and the transistor crystal 14 are a part of a thermally integrated assembly, it is obvious that the temperature of both of these components will always be substantially the same. Thus, any increase in temperature of the transistor crystals 14 will be sensed immediately by the thermistor 42.

Before entering into an explanation of the operation of the transistor as illustrated in FIG. 4, it is well to recognize the resistance characteristics of a conventional thermistor of the type used herein. A thermistor has a thermal negative coefficient of resistance as negative resistance characteristic which is evidenced by a decrease in resistance with an increase in temperature. While a thermistor has been specified for the part 42, it will appear as obvious from the following explanation that any material having a negative resistance characteristic may be used instead. A disc of sintered manganese zinc oxide is particularly suitable as the disc 42, such a disc being sold by the Ferroxcube Corporation of America under Thermistor Part No. B8-320-00A/130E.

In explaning the operation of the invention, it is first assumed that a current $I_{co}$ is flowing in the collector circuit. When thermal runaway occurs, $I_{co}$ increases rapidly with increased temperature of the transistor, and it is possible for this current to increase to a point at which the transistor burns out. However, when the transistor increases in temperature, the thermistor 42 also increases in temperature and thereby reduces in resistance. A back-bias between the emitter 20 and base 18 is thereby developed in a direction which reduces the collector current such that as the temperature increases the collector current $I_{co}$ is caused to drop. In an operating model of the invention, it has been found that if the temperature of the transistor exceeds a predetermined value, the back-bias developed by the reduced resistance of the thermistor 42 can reduce the current $I_{co}$ to a point at which the transistor circuit becomes inoperative. Thus, the thermistor 42 serves the purpose of preventing thermal runaway and thereby affords greater protection against the transistor fom burning out due to increased temperatures.

Emitter current, in a transistor, is equal to the sum of the collector and base currents. The beta of the transistor is defined as the change in collector current divided by the change in base current, and is otherwise represented by the formula $$\frac{\Delta I_c}{\Delta I_b}$$

Since the presence of the thermistor 42 directly effects the collector current $I_{co}$, it is obvious that the resistance of the thermistor may be used in determining the beta of the transistor at a predetermined temperature, such as twenty-five (25°) degrees C. Thus, the beta of the transistor of FIG. 2 will be determined in part by the resistance of the thermistor 42 which is coupled across the base and emitter portions.

This influence on the beta value is utilized in the present invention in connection with converting transistors having unusable beta values into transistors of proper beta value. This is accomplished in the manufacturing process as follows.

After the basic transistor has been fabricated without the potting compound and thermistor 42 in place, the beta of the transistor is measured. At this point, let it be assumed that it is desired to obtain a beta value of forty (40) and that the transistor measures a beta value of sixty-five (65). This means, therefore, that the transistor has the beta value of twenty-five (25) in excess of that which is correct.

This beta value of "65" is lowered by the presence of the thermistor 42 by determining that amount of thermistor which is connected in shunt between the base and emitter elements 18 and 20, respectively, of the transistor. This beta is lowerd as follows. After the thermistor 42 has been bonded into place as illustrated in FIG. 3, a certain portion of the upper surface of the thermistor is covered by epoxy potting compound. By use of an empirical formula, that portion of the surface which should be covered to lower the beta value by twenty-five (25) points may be predetermined. After this potting compound is hardened, the amalgam 46 is added as before. However, this amalgam only contacts a portion of the upper surface of the thermistor 42 which will result in a certain increase in resistance of the thermistor in the circuit of FIG. 4, over that which would be present if the entire upper surface of the thermistor were covered by amalgam. In this example given, it is assumed that this increased value of resistance is adequate to lower the Beta from a value of sixty-five (65) to forty (40).

In a second example, if it is assumed that the beta of the original transistor were seventy-five (75), it is seen that less of the upper surface area of the thermistor 42 should be covered by the potting compound so as to introduce less resistance of the thermistor than in the previous example. The beta of the transistor is lowered a greater amount, specifically thirty-five (35) points. Thus, it is amply demonstrated that the beta of a transistor may be easily and accurately established by the simple process of placing more or less of a thermistor 42 in the transistor circuit. Once the proper beta value has been achieved, the thermistor serves a second important purpose, as already explained, of stabilizing the transistor against thermal runaway.

Since the potting compound 40, the annular wall 38, the amalgam 46 and the cover 48 (FIG. 2) are all good conductors of heat, it is obvious that maximum dissipation of heat away from the transistor crystal 14 may be achieved. Further, since the potting compound 40 completely submerges all of the delicate components of the transistor, a rigid structure is produced. This rigid structure has substantial shock resistance. While these improvements in heat dissipation and shock resistance are realized, simultaneously therewith the thermal characteristics of the transistor are improved in addition to the availability of producing a transistor of a preselected beta value.

While I have described above the principles of my invention in connection with specific apparatus, it is to be clearly understood that this description is made only by way of example and not as a limitation to the scope of my invention.

What is claimed is:

1. A transistor device comprising a metallic mounting plate, a transistor crystal having emitter, base and collector portions, the collector portion being mounted directly onto the mounting plate, two terminal leads passing through said mounting plate and being insulated therefrom, said leads being spaced apart, a base connection leading from said base portion to one of said leads, an emitter connection leading from said emitter portion to the other of said leads, a disc of material having a negative resistance characteristic having one surface thereof coated with conductive material, said disc being superposed onto said one lead with said one surface being in electrical contact therewith, an annular wall of insulation surrounding said crystal, said leads and said disc and being secured at one end to said mounting plate, epoxy-aluminum insulation material partially filling the space inside said annular wall to just cover said crystal and the periphery of said disc leaving the other disc surface and said other lead exposed, said epoxy-aluminum material bonding said disc into place with respect to said leads and said crystal, amalgam filling the remaining space inside said wall and covering said epoxy-aluminum material, said other disc surface and said other lead, said amalgam electrically connecting said other disc surface to said other lead, and a cover fitted over said wall and amalgam.

2. The transistor device of claim 1 wherein a material which is non-corrosive to said crystal separates said crystal from said epoxy-aluminum material.

3. A transistor device comprising a metallic mounting plate, a transistor crystal having emitter, base and collector portions, the collector portion being mounted directly onto the mounting plate, two terminal leads passing through said mounting plate and being insulated therefrom, said leads being spaced apart, a base connection leading from said base portion to one of said leads, an emitter connection leading from said emitter portion to the other of said leads, a disc of material having a negative resistance characteristic having one surface thereof coated with conductive material, said disc being superposed onto said one lead with said one surface being in electrical contact therewith, an annular wall of insulation surrounding said crystal, said leads and said disc and being secured at one end to said mounting plate, epoxy-aluminum insulating material partially filling the space inside said annular wall to just cover said crystal and the periphery of said disc leaving the other disc surface and said other lead exposed, said epoxy-aluminum material bonding said disc into place with respect to said leads and said crystal, and amalgam filling the remaining space inside said wall and covering said epoxy-aluminum material, said other disc surface and said other lead, said amalgam electrically connecting said other disc surface to said other lead.

4. A transistor device comprising a metallic mounting plate, a transistor crystal having emitter, base and collector portions, the collector portion being mounted directly onto the mounting plate, two terminal leads passing through said mounting plate and being insulated therefrom, said leads being spaced apart, a base connection leading from said base portion to one of said leads, an emitter connection leading from said emitter portion to the other of side leads, a discs of material having a negative resistance characteristic, said disc having one surface superposed onto said one lead to make electrical contact therewith, an annular wall of insulation surrounding said crystal, said leads and said disc and being secured at one end to said mounting plate, epoxy-aluminum insulating material partially filling the space inside said anular wall to just cover said crystal and the periphery of said disc leaving the other disc surface and said other lead exposed, said epoxy-aluminum material bonding said disc into place with respect to said leads and said crystal, and amalgam filling the remaining space inside said wall and covering said aluminum material, said other disc surface and said other lead, said amalgam electrically connecting said other disc surface to said other lead.

5. A transistor device comprising a metallic mounting plate, a transistor crystal having emitter, base and collector portions, the collector portion being mounted directly onto the mounting plate, two terminal leads passing through said mounting plate and being insulated therefrom, said leads being spaced apart, a base connection leading from said base portion to one of said leads, an emitter connection leading from said emitter portion to the other of said leads, a disc of material having a thermal negative coefficient of resistance, said disc having one surface superposed onto said one lead to make electrical contact therewith, said disc being in intimately thermally conductive contact with said emitter, base and collector portions, and means which is bi-directionally conductive electrically connecting the other disc surface to the other lead.

6. A transistor device comprising a metallic mounting plate, a transistor crystal having base, emitter and collector portions, said crystal being mounted on said plate in heat-transferring relation, a first lead electrically connected to said base portion, a second lead electrically connected to said emitter portion, and an element of thermal negative coefficient of resistance material electrically directly connected across said emitter and base portions, said crystal and at least a portion of said element being potted in a material which is thermally conductive but electrically non-conductive, said potting material being in intimate thermal contact with said mounting plate.

7. A transistor device comprising a metallic mounting plate, a transistor crystal having base, emitter and collector portions, said crystal being mounting on said plate in heat-transferring relation, and an element of thermal negative coefficient of resistance material electrically directly connected across said emitter and base portions, said crystal and at least a portion of said element being potted in a material which is thermally conductive but electrically non-conductive, said potting material being in intimate thermal contact with said mounting plate.

8. A transistor device comprising a crystal having base, emitter and collector portions, and element of thermal negative coefficient of resistance material, means which is bidirectionally conductive electrically directly connecting said element across said emitter and base portions, and means thermally directly connecting said element to said crystal, said bidirectionally conductive means being directly thermally connected to said crystal.

9. A transistor device comprising a crystal having base, emitter and collector portions, and an element of thermal negative coefficient of resistance material, means which is bidirectionally conductive electrically directly connecting said element across said emitter and base portions; said crystal said bidirectionally conductive means and said element being in intimate thermal contact with a material which is thermally conductive but electrically non-conductive and in which said crystal is potted.

10. A transistor device having base, emitter and collector portions, resistance means for limiting collector current, and thermally conductive but electrically non-conductive material intimately coupling said means to said portions whereby the temperature of said means will be maintained at the same temperature as said portions, said resistance beans being of a thermal negative coefficient of resistance material, and means which is bidirectionally conductive directly connecting said resistance means between said base and emitter portion, said last-mentioned means also being intimately thermally coupled to said portions thereby being maintained at the same temperature.

References Cited by the Examiner

UNITED STATES PATENTS

| | | | |
|---|---|---|---|
| 2,655,610 | 10/53 | Ebers | 307—88.5 |
| 2,846,592 | 8/58 | Rutz | 307—88.5 X |
| 2,881,370 | 4/59 | Colson | 317—234 |
| 2,906,931 | 9/59 | Armstrong | 317—234 |
| 2,991,405 | 7/61 | Carlson | 307—88.5 |
| 3,013,104 | 12/61 | Young | 317—234 |
| 3,017,520 | 1/62 | Maupin | 317—235 |

DAVID J. GALVIN, *Primary Examiner.*

SAMUEL BERNSTEIN, BENNETT G. MILLER, *Examiners.*